(12) United States Patent
Ito et al.

(10) Patent No.: US 7,843,089 B2
(45) Date of Patent: Nov. 30, 2010

(54) SEMICONDUCTOR DEVICE

(75) Inventors: Mikihiko Ito, Tokyo (JP); Masaru Koyanagi, Tokyo (JP); Katsuki Matsudera, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 305 days.

(21) Appl. No.: 11/780,240

(22) Filed: Jul. 19, 2007

(65) Prior Publication Data

US 2008/0019203 A1 Jan. 24, 2008

(30) Foreign Application Priority Data

Jul. 19, 2006 (JP) ............................. 2006-196505

(51) Int. Cl.
*H01B 7/30* (2006.01)
(52) U.S. Cl. ..................................... 307/147
(58) Field of Classification Search .................. 307/147
See application file for complete search history.

(56) References Cited

U.S. PATENT DOCUMENTS

| | | | |
|---|---|---|---|
| 6,822,921 B2 | 11/2004 | Otsuka | |
| 7,233,065 B2 * | 6/2007 | Watanabe et al. | 257/723 |
| 2007/0001298 A1 * | 1/2007 | Ozawa et al. | 257/723 |
| 2007/0096291 A1 * | 5/2007 | Kawabata et al. | 257/700 |
| 2007/0246807 A1 * | 10/2007 | Hara et al. | 257/666 |
| 2007/0251719 A1 * | 11/2007 | Sturdivant | 174/250 |

FOREIGN PATENT DOCUMENTS

JP 2003-100894 4/2003

OTHER PUBLICATIONS

U.S. Appl. No. 11/960,097, filed Dec. 19, 2007, Kodama, et al.

* cited by examiner

*Primary Examiner*—Robert L. Deberadinis
(74) *Attorney, Agent, or Firm*—Oblon, Spivak, McClelland, Maier & Neustadt, L.L.P.

(57) ABSTRACT

A semiconductor device comprises a board; a semiconductor chip; a memory controller operative to control the semiconductor chip; and a power supply chip having a capacitor. The semiconductor chip is stacked on the board. The memory controller and the power supply chip are stacked on the semiconductor chip. The capacitor is used to stabilize the voltage applied to the semiconductor chip.

10 Claims, 13 Drawing Sheets

SEMICONDUCTOR DEVICE

CROSS-REFERENCE TO RELATED APPLICATION

This application is based upon and claims the benefit of priority from the prior Japanese Patent Application No. 2006-196505, filed on Jul. 19, 2006, the entire contents of which are incorporated herein by reference.

BACKGROUND OF THE INVENTION

1. Field of the Invention

The present invention relates to a semiconductor device that contains a power supply chip, a semiconductor chip and a memory controller in one package.

2. Description of the Related Art

Previously, one or more chips including a semiconductor chip and a memory controller can be contained in one package through a technology called multi-chip package (MCP). A multi-chip package memory system can be mounted in a small area and is now widely used accordingly.

In such multi-chip packages, the package size is increasingly reduced. This causes two problems. The first problem is associated with the chip area that should be so sized that it can be contained within the package. The second problem is associated with the presence of many restrictions on bonding wires for electrical connection between chips in the package with package board circuit patterns. These problems are made further difficult to solve because of the presence of a power stabilizing capacitor arranged on the package board. A shortened distance between the bonding wire and board circuit pattern and the capacitor lowers the yield and elevates the cost correspondingly. Also in the semiconductor chip and the memory controller, fine patterning of devices proceeds rapidly while the cost required for fine processes is still high.

On the other hand, a peripheral circuit required for operating an internal circuit, in particular, a power supply chip for generating an internal potential, is not fine patterned sufficiently because it requires a capacitor, and so on. Accordingly, the production of such the power supply chip through fine processes increases the cost as a problem.

Over such the problems, various devises have been attempted to reduce the occupied area (see, for example, JP-A 2003-100894). In the technology disclosed in JP-A 2003-100894, a bonding pad is formed on an upper portion of a cell region and no region is prepared for bonding pad formation in the peripheral circuit to reduce the chip area.

SUMMARY OF THE INVENTION

In one aspect the present invention provides a semiconductor device, comprising: aboard; a semiconductor chip; a memory controller operative to control the semiconductor chip; and a power supply chip having a capacitor, wherein the semiconductor chip is stacked on the board, wherein the memory controller and the power supply chip are stacked on the semiconductor chip, wherein the capacitor is used to stabilize the voltage applied to the semiconductor chip.

DETAILED DESCRIPTION OF THE EMBODIMENTS

Figure 18:
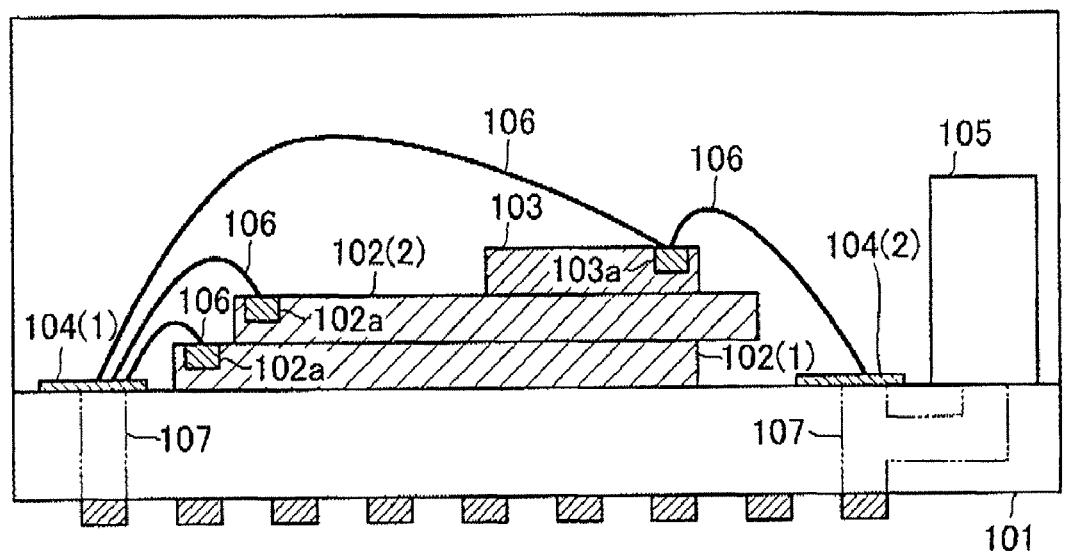
FIG. 18 is a brief side view of a semiconductor device of prior art.

FIG. 18 is referenced first to describe a configuration of a conventional, general, multi-chip package semiconductor device (memory system). For example, the conventional semiconductor device comprises a package board 101, semiconductor chips 102(1), 102(2) stacked on the package board 101, and a memory controller 103 arranged on the semiconductor chip 102(2). The semiconductor chips 102(1), 102(2) and the memory controller 103 have respective electrically connectable bonding pads 102a, 102a, 103a formed thereon. The semiconductor device also comprises board circuit patterns 104(1), 104(2) and a capacitor 105 on the package board 101. The bonding pads 102a, 103a are electrically connected to the board circuit patterns 104(1), 104(2) via bonding wires 106. The capacitor 105 has a leg, which is electrically connected to the board circuit pattern 104(4) via a board wiring pattern 107. At least one of the board circuit patterns 104(1) and 104(2) is electrically connected to an external device (not shown) to receive and send various signals. A signal from the external device is supplied via the board circuit patterns 104(1), 104(2), the board wiring pattern 107 and the bonding wires 106 to the semiconductor chips 102(1), 102(2), the memory controller 103 and the capacitor 105.

The prior art as described above has a problem mainly associated with the area occupied by the capacitor 105.

Hereinafter, the drawings are referenced to describe an embodiment of the present invention.

First Embodiment

Figure 1:
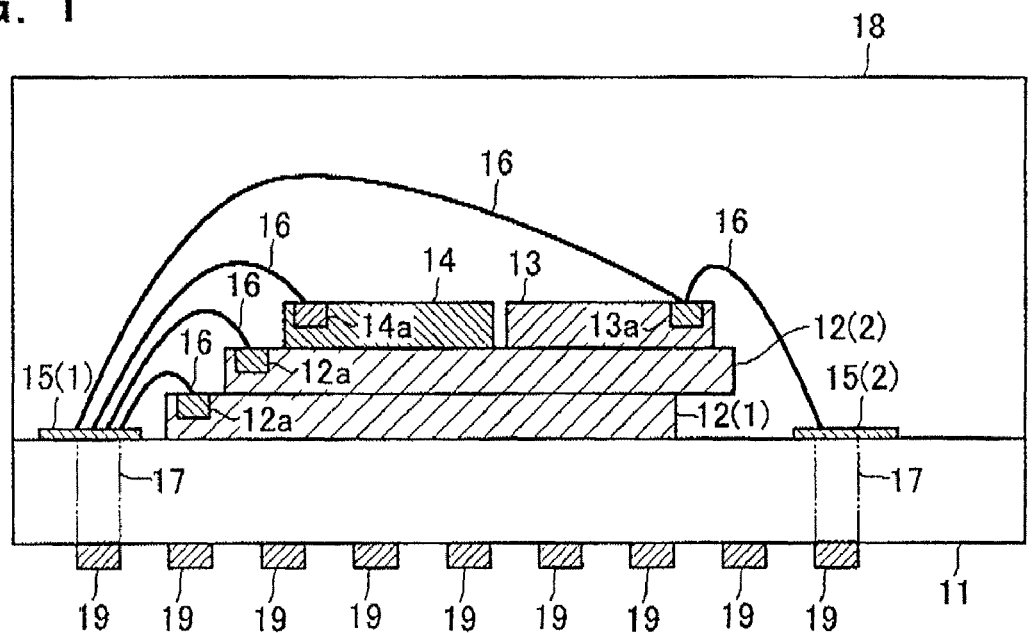
FIG. 1 is a brief side view of a semiconductor device according to a first embodiment of the present invention.

FIG. 1 is referenced to describe a semiconductor device according to a first embodiment of the present invention. FIG. 1 is a brief diagram of the semiconductor device according to the first embodiment.

As shown in FIG. 1, the semiconductor device according to the first embodiment of the present invention comprises a package board 11, semiconductor chips 12(1), 12(2) stacked on the package board 11, a memory controller 13 arranged on the semiconductor chip 12(2), and a power supply chip 14 having a capacitor function inside. The semiconductor chips 12(1), 12(2) may include, but not particularly limited to, storage devices such as NAND-type flash memories. The semiconductor chips 12(1), 12(2), the memory controller 13 and the power supply chip 14 have respective electrically connectable bonding pads 12a, 12a, 13a, 14a formed thereon. To prevent the bonding pads 12a, 13a from overlapping and remaining hidden (in other words, to enable bonding), the two semiconductor chips 12(1), 12(2) and the power supply chip 14 are stacked as deviated so that one ends thereof are arranged in a stepwise form from below in this order. The memory controller 13 is stacked in parallel with the power supply chip 14 on the semiconductor chip 12(2). The semiconductor device also comprises a sealant 18 for sealing the above structure stacked on the package board 11, and solder balls 19 provided on a lower surface of the package board 11.

The semiconductor device comprises board circuit patterns 15(1), 15(2) on the upper surface of the package board 11 at both ends. The bonding pads 12a, 12a, 13a, 14a on the two semiconductor chips 12(1), 12(2), the memory controller 13 and the power supply chip 14 are electrically connected to the board circuit pattern 15(1) via bonding wires 16. The bonding pad 13a on the memory controller 13 is electrically connected via a bonding wire 16 to the board circuit pattern 15(2) located at the opposite end from the board circuit pattern 15(1). The board circuit patterns 15(1), 15(2) are electrically connected to the solder balls 19 via board wiring patterns 17.

The board circuit patterns 15(1), 15(2) are electrically connected to external devices (not shown) to receive signals. The signals from the external devices are supplied from the solder balls 19 via the board circuit patterns 15(1), 15(2) and the bonding wires 16 to the semiconductor chips 12(1), 12(2), the memory controller 13 and the power supply chip 14.

Figure 2:
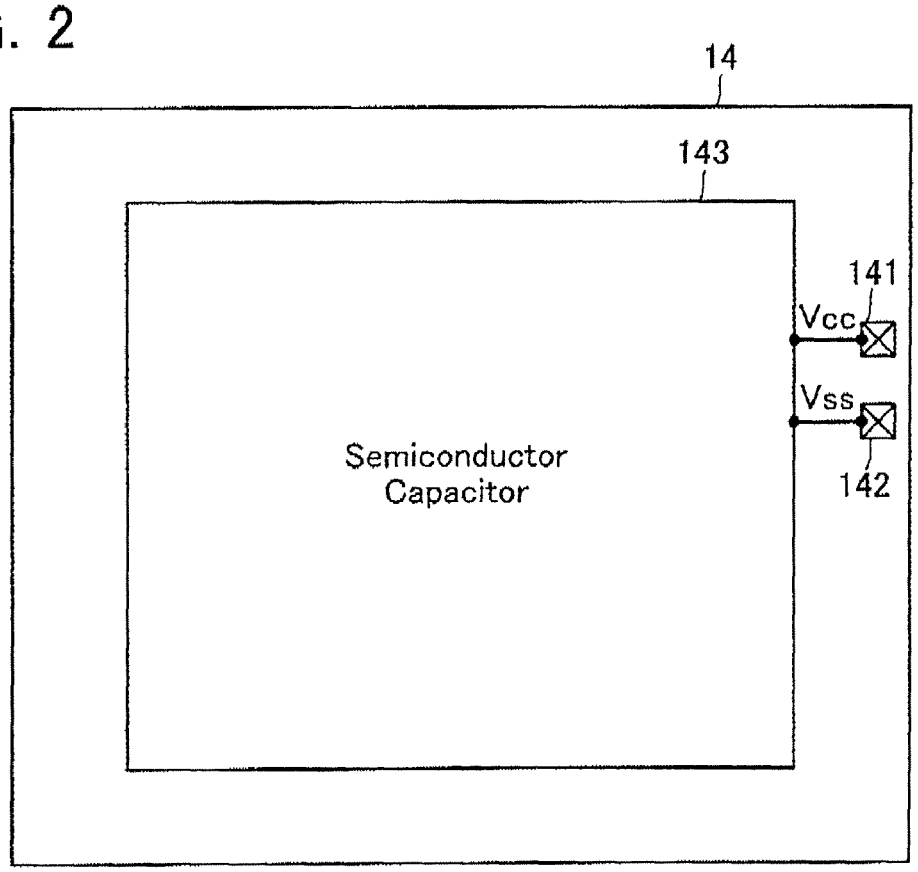
FIG. 2 is a brief diagram of a power supply chip in the semiconductor device according to the first embodiment of the present invention.

FIG. 2 is referenced next to describe a configuration of the power supply chip 14. FIG. 2 is a brief diagram showing the configuration of the power supply chip 14.

As shown in FIG. 2, the power supply chip 14 according to the first embodiment includes a supply voltage pad 141 that is supplied with power, a ground voltage pad 142 that is grounded, and a semiconductor capacitor 143 connected to the supply voltage pad 141 and the ground voltage pad 142. The supply voltage pad 141 and the ground voltage pad 142 correspond to the bonding pads 14a in FIG. 1.

The semiconductor capacitor 143 includes an N-channel MOS transistor with a gate electrode connected to the supply voltage pad 141 and a source and a drain electrode connected to the ground voltage pad 142.

Thus, the configuration of the power supply chip 14 including the semiconductor capacitor 143 makes it possible to use the charge accumulated on the semiconductor capacitor 143 even if the supply voltage can not be applied temporarily from external. The use of the charge suppresses the drop in supply voltage caused by power consumption in accordance with the operations of the semiconductor chip 12 and the memory controller 13 and stabilizes the supply voltage.

In the present embodiment, instead of the capacitor arranged separately on the package board as in the prior art, the power supply chip 14 including the semiconductor capacitor 143 is stacked on the semiconductor chip 12(2). Therefore, the restriction on the chip area of the semiconductor chip and the memory controller can be relieved when the packaged is downsized.

Further, the configuration of the above first embodiment can relieve the spatial restriction between chips. In addition, the relief from the spatial restriction improves the yield on production. Accordingly, it is possible to realize a multi-chip package semiconductor device (memory system) at a low cost. The above first embodiment includes two semiconductor chips 12(1), 12(2) but may include a single semiconductor chip 12(1) (or 12(2)). Alternatively, it may include more than two semiconductor chips.

Second Embodiment

Figure 3:
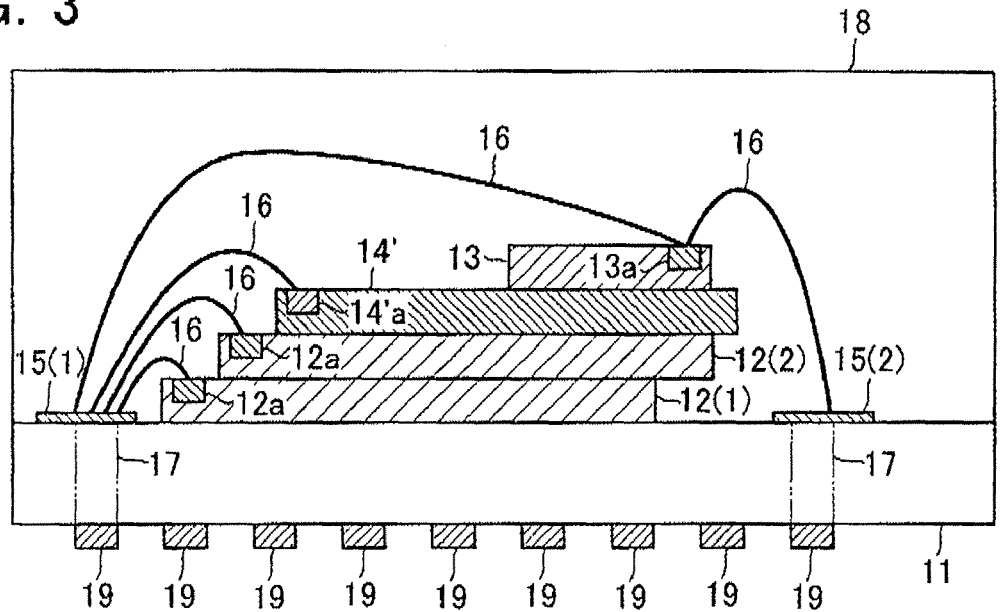
FIG. 3 is a brief side view of a semiconductor device according to a second embodiment of the present invention.

FIG. 3 is referenced next to describe a configuration of a semiconductor device according to a second embodiment of the present invention. FIG. 3 is a side view showing the configuration of the semiconductor device according to the second embodiment of the present invention. The same components as those in the first embodiment are denoted with the same reference numerals and omitted from the following description.

As shown in FIG. 3, different from the first embodiment, in the semiconductor device according to the second embodiment, a power supply chip 14' is formed having as large a size as extending over the entire surface of the semiconductor chip 12(2). In addition, the memory chip 13 is stacked on the power supply chip 14'. To prevent bonding pads 12a, 12a, 14'a from overlapping and remaining hidden (in other words, to enable bonding), the two semiconductor chips 12(1), 12(2) and the power supply chip 14' are stacked as deviated so that one ends thereof are arranged in a stepwise form such that the semiconductor chip 12(1), the semiconductor chip 12(2), the power supply chip 14' and the memory chip 13 are stacked in this order.

The configuration of the semiconductor device according to the second embodiment as above can relieve the spatial restriction between chips. In addition, the relief from the spatial restriction improves the yield on production. Accordingly, it is possible to realize a multi-chip package semiconductor device (memory system) at a low cost.

Third Embodiment

Figure 4:
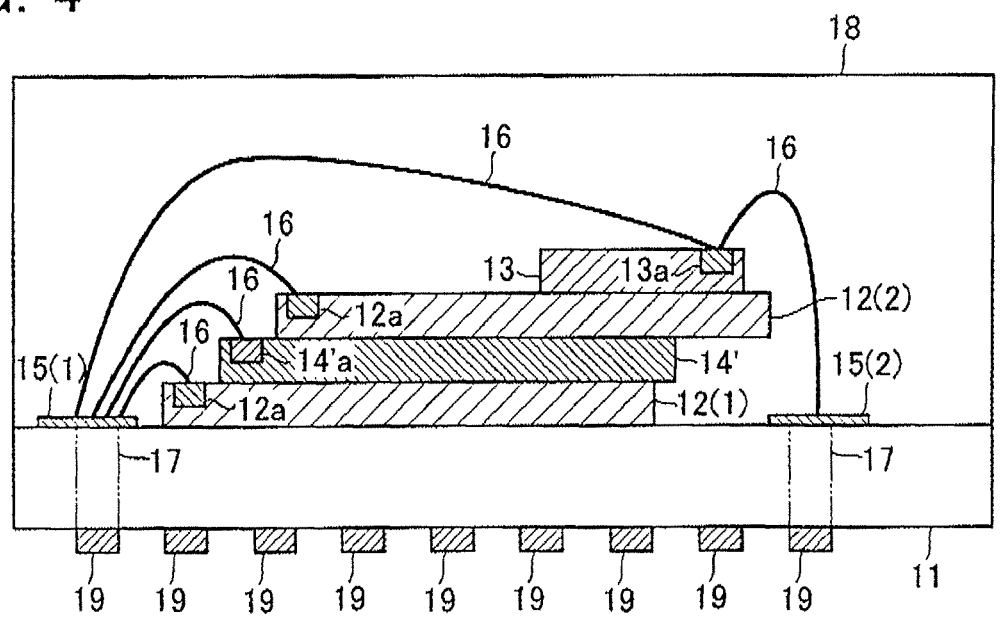
FIG. 4 is a brief side view of a semiconductor device according to a third embodiment of the present invention.

FIG. 4 is referenced next to describe a configuration of a semiconductor device according to a third embodiment of the present invention. FIG. 4 is a side view showing the configuration of the semiconductor device according to the third embodiment of the present invention. The same components as those in the second embodiment are denoted with the same reference numerals and omitted from the following description.

As shown in FIG. 4, in the semiconductor device according to the third embodiment, to prevent bonding pads 12a, 12a, 13a, 14'a from overlapping and remaining hidden (in other words, to enable bonding), the semiconductor chip 12(1), the power supply chip 14', the semiconductor chip 12(2) and the memory chip 13 are stacked as deviated so that one ends thereof are arranged in a stepwise form on the package board 11 in this order, which is different from that in the second embodiment. In other word, the power supply chip 14' is interposed between the semiconductor chip 12(1) and the semiconductor chip 12(2).

The configuration of the semiconductor device according to the third embodiment as above can relieve the spatial restriction between chips. In addition, the relief from the spatial restriction improves the yield on production. Accordingly, it is possible to realize a multi-chip package semiconductor device (memory system) at a low cost.

Fourth Embodiment

Figure 5:
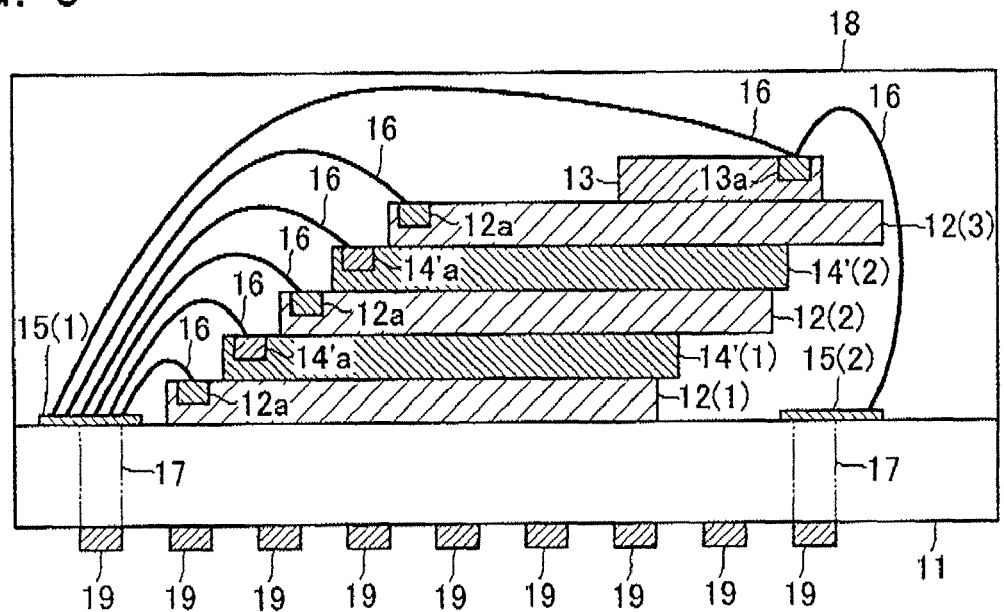
FIG. 5 is a brief side view of a semiconductor device according to a fourth embodiment of the present invention.

FIG. 5 is referenced next to describe a configuration of a semiconductor device according to a fourth embodiment of the present invention. FIG. 5 is a side view showing the configuration of the semiconductor device according to the fourth embodiment of the present invention. The same components as those in the third embodiment are denoted with the same reference numerals and omitted from the following description.

As shown in FIG. 5, the semiconductor device according to the fourth embodiment comprises another semiconductor chip and another power supply chip in addition to the configuration of the third embodiment. Thus, the semiconductor device according to the fourth embodiment comprises semiconductor chips 12(1)-12(3), the memory controller 13, and power supply chips 14'(1), 14'(2). These semiconductor chip 12(1), power supply chip 14' (1), semiconductor chip 12(2), power supply chip 14'(2) and semiconductor chip 12(3) are stacked as deviated so that one ends thereof are arranged in a stepwise form on the package board 11 in this order to prevent bonding pads 12a, 13a, 14'a formed thereon from overlapping and remaining hidden (in other words, to enable bonding), and the memory controller 13 is arranged on the semiconductor chip 12(3).

The following description is given to electrical connections between the semiconductor chips 12(1)-12(3), the memory controller 13, and the power supply chips 14'(1), 14'(2). The bonding pads 12a, 12a, 12a on the semiconductor chips 12(1)-12(3) and the bonding pads 14'a, 14'a on the power supply chips 14'(1), 14'(2) are electrically connected to the board circuit pattern 15(1) via bonding wires 16. The bonding pad 13a on the memory controller 13 is electrically connected to the circuit pattern 15(2) via a bonding wire 16.

The configuration of the semiconductor device according to the fourth embodiment as above can relieve the spatial restriction between chips. In addition, the relief from the spatial restriction improves the yield on production. Accordingly, it is possible to realize a multi-chip package semiconductor device (memory system) at a low cost.

The semiconductor chips are not limited to three 12(1)-12(3) as in the present embodiment but may include four or more. In addition, the power supply chips are not limited to two 14'(1) and 14'(2) but may include three or more.

Fifth Embodiment

Figure 6:
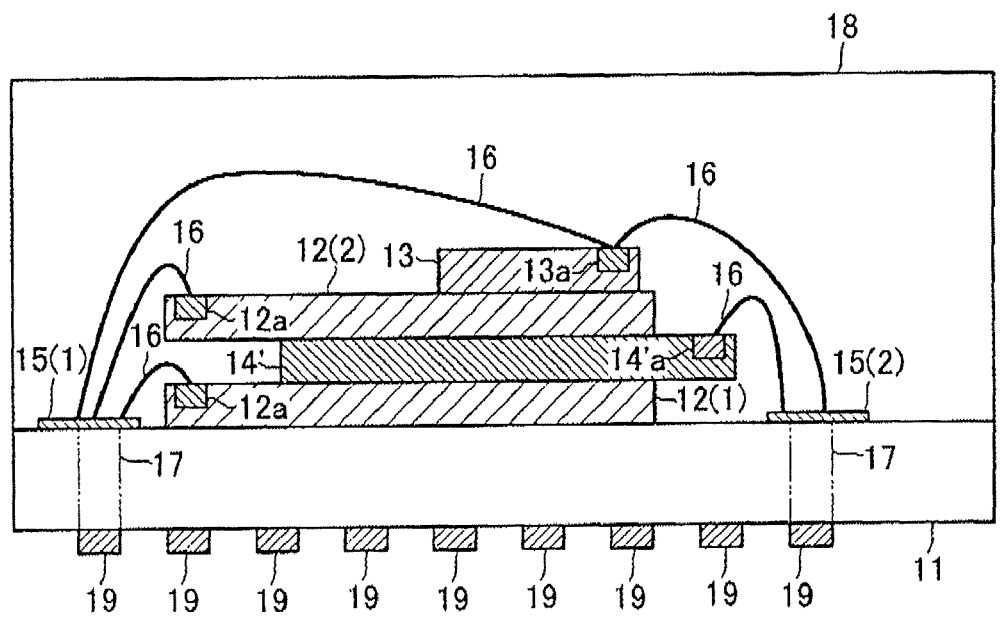
FIG. 6 is a brief side view of a semiconductor device according to a fifth embodiment of the present invention.

FIG. 6 is referenced next to describe a configuration of a semiconductor device according to a fifth embodiment of the present invention. FIG. 6 is a side view showing the configuration of the semiconductor device according to the fifth embodiment of the present invention. The same components as those in the second embodiment are denoted with the same reference numerals and omitted from the following description.

As shown in FIG. 6, the semiconductor device according to the fifth embodiment has almost the same configuration as the second embodiment. The difference in configuration between the semiconductor device of the fifth embodiment and that of the second embodiment is a positional relation of the semiconductor chips 12(1), 12(2) and the power supply chips 14' stacked. Namely, the semiconductor chip 12(1), the power supply chip 14', the semiconductor chip 12(2) and the memory chip 13 are stacked in this order. The semiconductor chips 12(1), 12(2) are arranged such that the ends provided with the bonding pads 12a are aligned in a direction parallel with the stacking direction. On the other hand, the power supply chip 14' is arranged as deviated toward the board circuit pattern 15(2) such that it is sandwiched between the semiconductor chips 12(1), 12(2) and that the bonding pad 14'a and the bonding pads 12a are exposed to enable bonding. Namely, the power supply chip 14' and the semiconductor chips 12(1), 12(2) are stacked as deviated alternately.

The following description is given to electrical connections between the semiconductor chips 12(1), 12(2), the memory controller 13 and the power supply chip 14'. The bonding pads 12a, 12a on the semiconductor chips 12(1), 12(2) and the bonding pad 13a on the memory controller 13 are electrically connected to the board circuit pattern 15(1) via bonding wires 16. The bonding pad 13a on the memory controller 13 and the bonding pad 14'a on the power supply chip 14' are electrically connected to the circuit pattern 15(2) via bonding wires 16.

In the configuration of the semiconductor device according to the fifth embodiment as above, between the semiconductor chip 12(1) on the first stage and the semiconductor chip 12(2) on the third stage, the power supply chip 14' is interposed. Accordingly, the semiconductor chip 12(1) and the semiconductor chip 12(2) can be stacked such that the lateral positions (the ends provided with the bonding pads 12a) are aligned for connections via bonding wires. Therefore, the restriction on the chip area can be relived better than the above-described embodiments.

Usually, in such the configuration, an inter-chip insert called spacer is arranged between the semiconductor chips 12(1), 12(2). Accordingly, the spacer increases the cost correspondingly. In the present embodiment, the power supply chip 14' also serves as a spacer, thereby eliminating the need for the spacer and realizing a multi-chip package at a much lower cost.

The configuration according to the above fifth embodiment can relieve the spatial restriction between chips similar to the first through fourth embodiments. In addition, the relief from the spatial restriction makes it possible to realize a multi-chip package semiconductor device (memory system) at a low cost.

Sixth Embodiment

Figure 7:
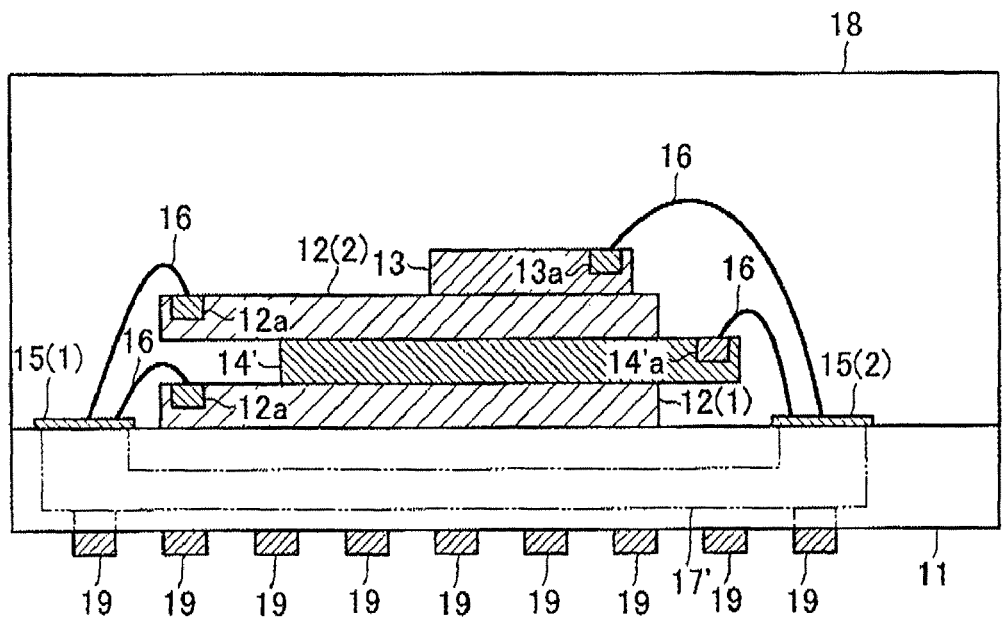
FIG. 7 is a brief side view of a semiconductor device according to a sixth embodiment of the present invention.

FIG. 7 is referenced next to describe a configuration of a semiconductor device according to a sixth embodiment of the present invention. FIG. 7 is a side view showing the configuration of the semiconductor device according to the sixth embodiment of the present invention. The same components as those in the fifth embodiment are denoted with the same reference numerals and omitted from the following description.

As shown in FIG. 7, the semiconductor device according to the sixth embodiment has almost the same configuration as the fifth embodiment. In the semiconductor device according to the sixth embodiment, the board circuit pattern 15(1) is electrically connected to the board circuit pattern 15(2) via a board wiring pattern 17' provided inside the package board 11, different from the fifth embodiment.

The following description is given to electrical connections between the semiconductor chips 12(1), 12(2), the memory controller 13 and the power supply chip 14'. The bonding pads 12a, 12a on the semiconductor chips 12(1), 12(2) are electrically connected to the board circuit pattern 15(1) via bonding wires 16. The bonding pad 13a on the memory controller 13 and the bonding pad 14'a on the power supply chip 14' are electrically connected to the circuit pattern 15(2) via bonding wires 16.

The configuration of the semiconductor device according to the sixth embodiment as above can shorten the length of the bonding wire 16 compared with the fifth embodiment. Therefore, it is possible to decrease the inductance proportioned to the length of the bonding wire 16 and reduce the fluctuation of the supply voltage.

The configuration according to the above sixth embodiment can relieve the spatial restriction between chips similar to the first through fifth embodiments. In addition, the relief from the spatial restriction makes it possible to realize a multi-chip package semiconductor device (memory system) at a low cost.

Seventh Embodiment

Figure 8:
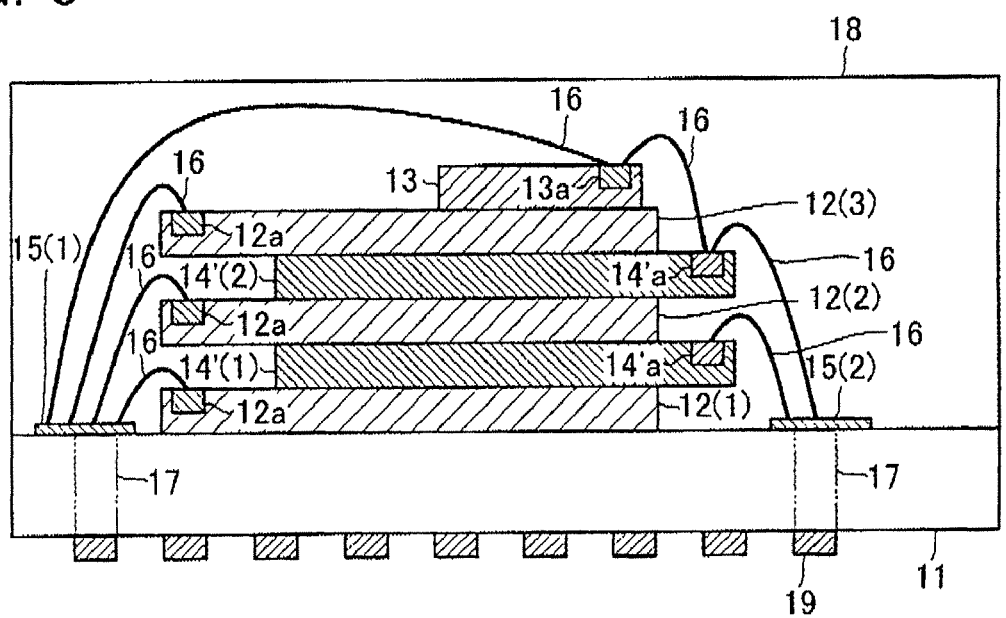
FIG. 8 is a brief side view of a semiconductor device according to a seventh embodiment of the present invention.

FIG. 8 is referenced next to describe a configuration of a semiconductor device according to a seventh embodiment of the present invention. FIG. 8 is a side view showing the configuration of the semiconductor device according to the seventh embodiment of the present invention. The same components as those in the seventh embodiment are denoted with the same reference numerals and omitted from the following description.

As shown in FIG. 8, the semiconductor device according to the seventh embodiment comprises another semiconductor chip 12 and another power supply chip 14 in addition to the configuration of the fifth embodiment. Namely, the semiconductor device according to the fifth embodiment comprises semiconductor chips 12(1)-12(3), the memory controller 13, and power supply chips 14'(1), 14'(2). These semiconductor chip 12(1), power supply chip 14' (1), semiconductor chip 12(2), power supply chip 14'(2) and semiconductor chip 12(3) are stacked in this order. The semiconductor chips 12(1)-12(3) are arranged such that the ends provided with the bonding pads 12a are aligned in a direction parallel with the stacking direction. The power supply chips 14'(1), 14'(2) are arranged as deviated toward the board circuit pattern 15(2) such that they are sandwiched between the semiconductor chips 12(1), 12(2), 12(3) and that the bonding pad 14'a and the bonding pads 12a are exposed to enable bonding. Namely, the semiconductor chip 12(1), the semiconductor chip 12(2), the semiconductor chip 12(3), the power supply chip 14'(1), and the power supply chip 14'(2) are stacked as deviated alternately.

The following description is given to electrical connections between the semiconductor chips 12(1)-12(3), the memory controller 13 and the power supply chips 14'(1), 14'(2). The bonding pads 12a, 12a, 12a on the semiconductor chips 12(1)-12(3) and the bonding pad 13a on the memory controller 13 are electrically connected to the board circuit pattern 15(1) via bonding wires 16. The bonding pad 13a on the memory controller 13 is electrically connected to the bonding pad 14'a on the power supply chip 14'(2) via a bonding wire 16. The bonding pads 14'a, 14'a on the power supply chips 14'(1), 14'(2) are electrically connected to the board circuit pattern 15(2) via bonding wires 16.

The configuration according to the seventh embodiment as above can relieve the spatial restriction between chips similar to the first through sixth embodiments. In addition, the relief from the spatial restriction makes it possible to realize a multi-chip package semiconductor device (memory system) at a low cost.

Eighth Embodiment

Figure 9:
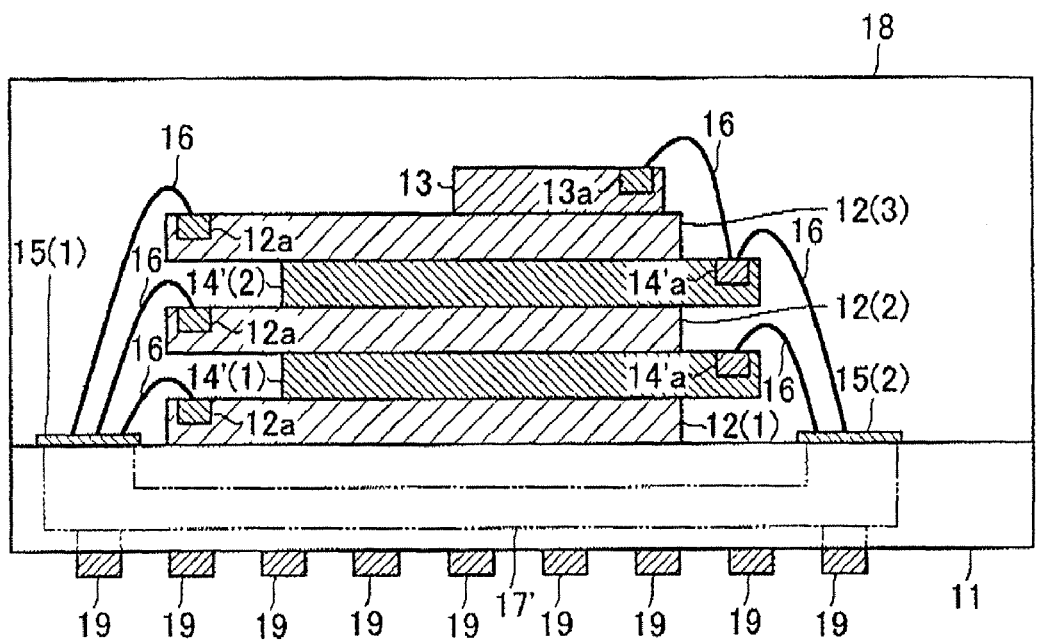
FIG. 9 is a brief side view of a semiconductor device according to an eighth embodiment of the present invention.

FIG. 9 is referenced next to describe a configuration of a semiconductor device according to an eighth embodiment of the present invention. FIG. 9 is a side view showing the configuration of the semiconductor device according to the eighth embodiment of the present invention. The same components as those in the seventh embodiment are denoted with the same reference numerals and omitted from the following description.

As shown in FIG. 9, the semiconductor device according to the eighth embodiment has almost the same configuration as the seventh embodiment. In the semiconductor device according to the eighth embodiment, the board circuit pattern 15(1) is electrically connected to the board circuit pattern 15(2) via a board wiring pattern 17' provided inside the package board 11, different from the seventh embodiment.

The following description is given to electrical connections between the semiconductor chips 12(1)-12(3), the memory controller 13 and the power supply chips 14'(1), 14'(2), stacked as above.

The bonding pads 12a, 12a, 12a on the semiconductor chips 12(1)-12(3) are electrically connected to the board circuit pattern 15(1) via bonding wires 16. The bonding pad 13a on the memory controller 13 is electrically connected to the bonding pad 14'a on the power supply chip 14'(2) via a bonding wire 16. The bonding pads 14'a, 14'a on the power supply chips 14'(1), 14'(2) are electrically connected to the circuit pattern 15(2) via bonding wires 16.

The configuration of the semiconductor device according to the eighth embodiment as above can shorten the length of the bonding wire compared with the seventh embodiment. Therefore, it is possible to decrease the inductance proportioned to the length of the bonding wire and reduce the fluctuation of the supply voltage.

The configuration according to the above eighth embodiment can relieve the spatial restriction between chips similar to the first through seventh embodiments. In addition, the relief from the spatial restriction makes it possible to realize a multi-chip package semiconductor device (memory system) at a low cost.

Ninth Embodiment

Figure 10:
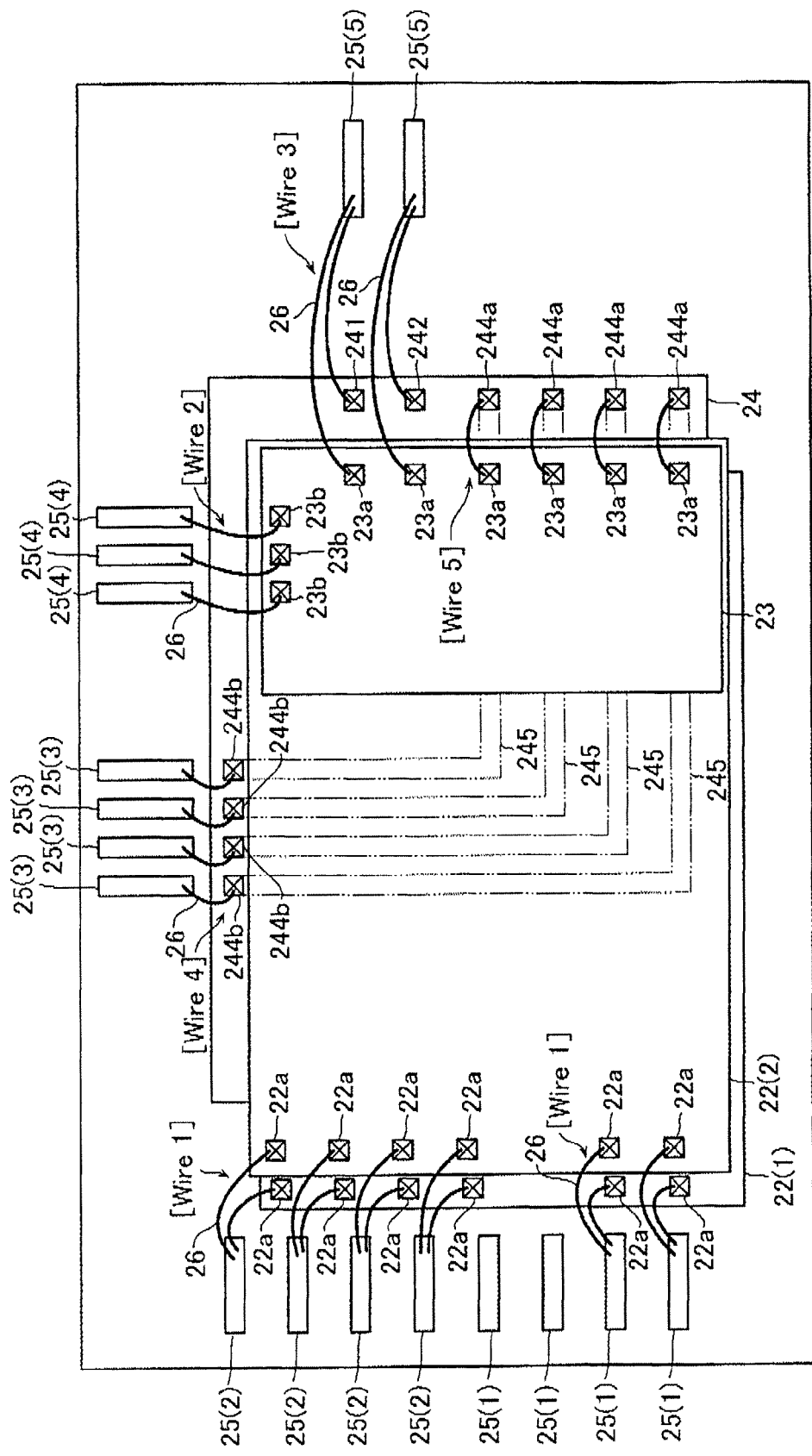
FIG. 10 is a brief top view of a semiconductor device according to a ninth embodiment of the present invention.
Figure 11:
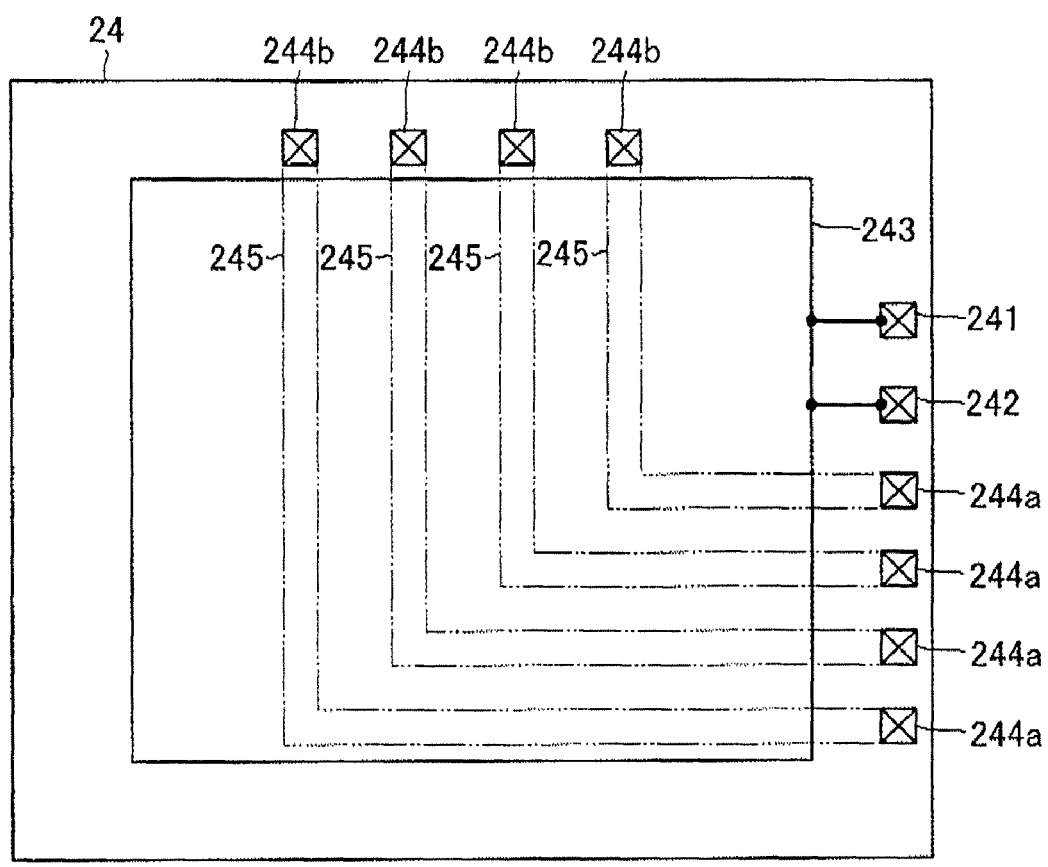
FIG. 11 is a brief side view of a power supply chip in the semiconductor device according to the ninth embodiment of the present invention.

FIGS. 10 and 11 are referenced next to describe a configuration of a semiconductor device according to a ninth embodiment of the present invention. FIG. 10 is a top view showing the configuration of the semiconductor device according to the ninth embodiment of the present invention.

As shown in FIG. 10, the semiconductor device according to the ninth embodiment comprises a package board 21. It also comprises rectangular semiconductor chips 22(1), 22(2), a memory controller 23, and a power supply chip 24 stacked on the package board 21. Also in the ninth embodiment, similar to the first through eighth embodiments, the sealant and solder balls are provided though they are omitted from the figure.

The package board 21 is provided with a plurality of board circuit patterns 25(1), 25(2) thereon along one short side edge and a plurality of board circuit patterns 25(5) along the other short side edge. The package board 21 is also provided with board circuit patterns 25(3), 25(4) thereon along one long side edge.

The semiconductor chips 22(1), 22(2) are provided with bonding pads 22a, 22a thereon along respective short side edges.

The memory controller 23 is provided with bonding pads 23a and 23b thereon along one long side edge and one short side edge.

As shown in FIG. 11, along one short side edge, the power supply chip 24 includes a supply voltage pad 241 that is supplied with power, and a ground voltage pad 242 that is grounded. The supply voltage pad 241 and the ground voltage pad 242 are connected to a semiconductor capacitor 243.

The semiconductor capacitor 243 includes an N-channel MOS transistor with a gate electrode connected to the supply voltage pad 241 and a source and a drain electrode connected to the ground voltage pad 242.

On a straight line extending from the supply voltage pad r) 241 to the ground voltage pad 242, first wiring pads 244a are provided. In addition, along a long side edge, second wiring pads 244b are provided. The first and second wiring pads 244a, 244b are electrically connected with each other via wiring patterns 245.

The following description is given to the arrangement associated with the package board 21, and the rectangular semiconductor chips 22(1), 22(2), the memory controller 23 and the power supply chip 24, which are stacked on the package board 21. The semiconductor chips 22(1), 22(2), the memory controller 23 and the power supply chip 24 are arranged as deviated like the above-described embodiments such that the bonding pads 22a, 23a, 241, 242, 244a, 244b and so forth can be subjected to bonding.

The semiconductor chip 22(1) is stacked on the package board 21 such that the bonding pads 22a are directed to adjoin the board circuit patterns 25(1), 25(2) on the package board 21.

The power supply chip 24 is stacked on the semiconductor chip 22(1) such that the supply voltage pad 241, the ground voltage pad 242 and the first wiring pads 244a are directed to adjoin the board circuit patterns 25(5) on the package board 21.

The semiconductor chip 22(2) is stacked on the power supply chip 24 such that the bonding pads 22a thereof are directed to adjoin the bonding pads 22a on the semiconductor chip 22(1).

The memory controller 23 is stacked on the semiconductor chip 22(2) such that the bonding pads 23a thereof are directed to adjoin the wiring pads 244a on the power supply chip 24.

FIG. 10 is referenced again to describe electrical connections between the semiconductor chips 22(1), 22(2), the memory controller 23 and the power supply chip 24. They are connected with each other via bonding wires 26. If a bonding wire 26 electrically connects a bonding pad "a" provided on a chip "A" to a bonding pad "b" provided on a chip "B", the connection is described as "A{a}-B{b}". The electrical connection relations through the bonding wires 26 ([Wire 1]-[Wire 5]) in the present embodiment include five wiring groups ([Wire 1]-[Wire 5]), which can be shown below using the above description.

| [Wire 1] | 22(1){22a}-21{25(1)} |
| | 22(1){22a}-21{25(2)} |
| | 22(2){22a}-21{25(1)} |
| | 22(2){22a}-21{25(2)} |

-continued

| [Wire 2] | 23{23b}-21{25(4)} |
| [Wire 3] | 23{23a}-21{25(5)} |
| | 24{241}-21{25(5)} |
| | 24{242}-21{25(5)} |
| [Wire 4] | 24{244b}-21{25(3)} |
| [Wire 5] | 23{23a}-24{244a} |

In the semiconductor device according to the ninth embodiment configured as above, the power supply chip 24 includes the wiring patterns 245, and accordingly this configuration can reduce the need for using bonding wires in connections extending along distance between pads. For example, in FIG. 10, electrical connections can be formed from the bonding pads 23a on the memory controller 23 via the wiring patterns 245 to the board circuit patterns 25(3).

Therefore, it is possible to suppress the risk of bringing adjacent bonding wires 26 into contact with each other to make a short circuit therebetween. In addition, the length of the bonding wire 26 can be shortened to lower the inductance.

The configuration according to the above ninth embodiment can relieve the spatial restriction between chips similar to the first through eighth embodiments. In addition, the relief from the spatial restriction makes it possible to realize a multi-chip package semiconductor device (memory system) at a low cost.

Tenth Embodiment

Figure 12:
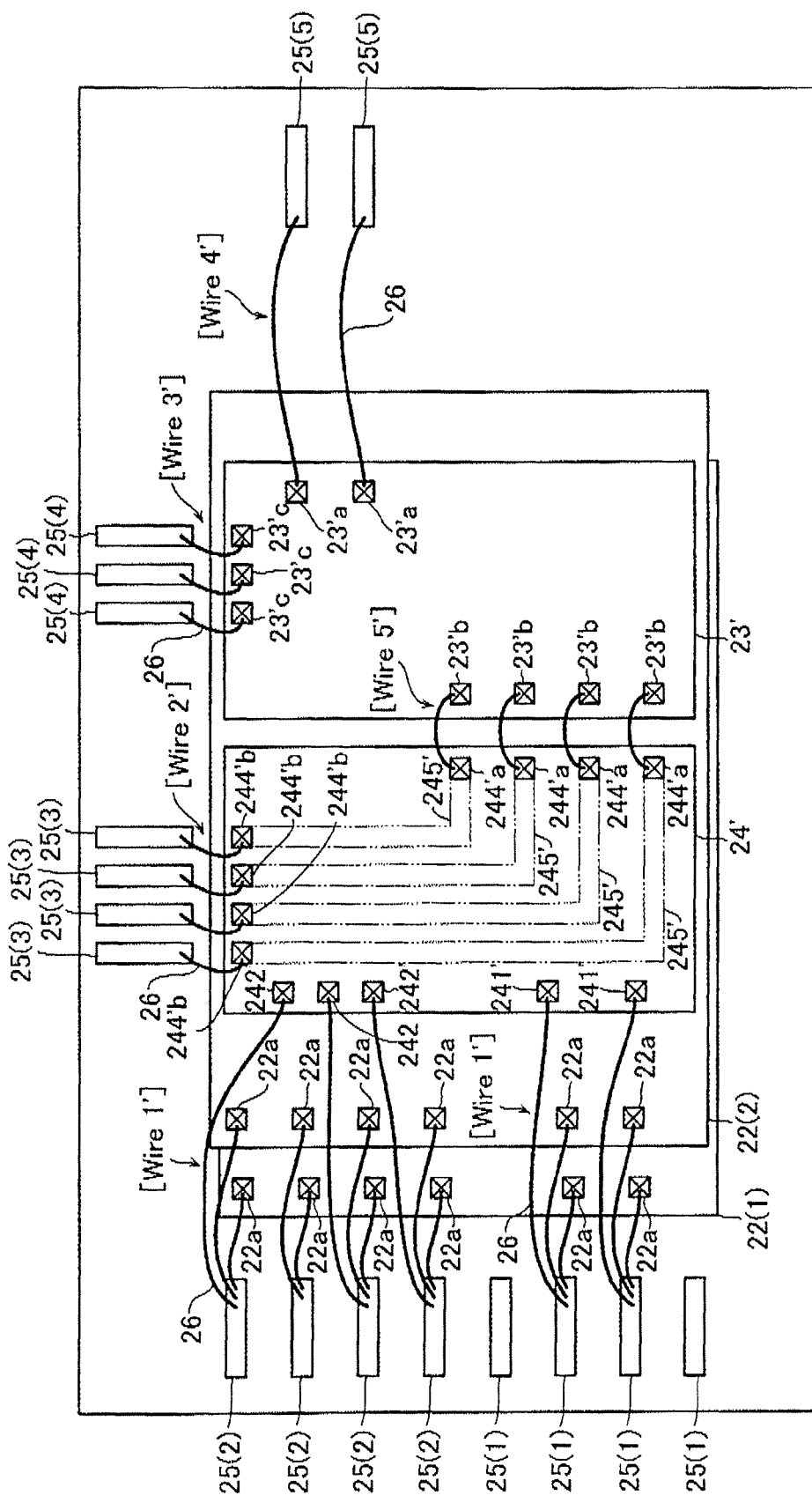
FIG. 12 is a brief top view of a semiconductor device according to a tenth embodiment of the present invention.

FIG. 12 is referenced next to describe a configuration of a semiconductor device according to a tenth embodiment of the present invention. FIG. 12 is a top view showing the configuration of the semiconductor device according to the tenth embodiment of the present invention. The same components as those in the ninth embodiment are denoted with the same reference numerals and omitted from the following description.

The semiconductor device according to the tenth embodiment is different from the ninth embodiment in configurations of a memory controller 23' and a power supply chip 24', shaped rectangular, and a stacked positional relation therebetween.

The memory controller 23' is rectangular and includes bonding pads 23'a, 23'b arrayed along two long side edges and bonding pads 23'c arrayed along one short side edge.

The power supply chip 24' is rectangular and includes a plurality of supply voltage pads 241' and a plurality of ground voltage pads 242' along one long side edge. The power supply chip 24' also includes a plurality of first wiring pads 244'a along the other long side edge. The power supply chip 24' on the other hand includes a plurality of second wiring pads 244'b along one short side edge. The first wiring pads 244'a are electrically connected to the second wiring pads 244'b via wiring patterns 245'.

The following description is given to the arrangement associated with the package board 21, and the rectangular semiconductor chips 22(1), 22(2), the memory controller 23' and the power supply chip 24', which are stacked on the package board 21. The bonding pads 22a, 23'a, 23'b, 23'c, 244'a, 244'b, 241', 242' and so forth are arranged as deviated to enable bonding, like the above embodiments.

The semiconductor chip 22(1) is stacked on the package board 21 such that the bonding pads 22a are directed to adjoin the board circuit patterns 25(1), 25(2) on the package board 21.

The semiconductor chip 22(2) is stacked on the semiconductor chip 22(1) such that the bonding pads 22a thereof are directed to adjoin the bonding pads 22a on the semiconductor chip 22(1).

The power supply chip 24' is stacked on the semiconductor chip 22(2) such that the wiring pads 244'b are directed to adjoin the board circuit patterns 25(3) on the package board 21. In other words, the power supply chip 24' is arranged such that the supply voltage pads 241' and the ground voltage pads 242' are directed to adjoin the bonding pads 22a on the semiconductor chip 22(2) and that the wiring pads 244'a are directed to adjoin the bonding pad 23'b on the memory controller 23'.

The memory controller 23' is stacked on the semiconductor chip 22(2) in parallel with the power supply chip 24' such that the bonding pads 23'a thereof are directed to adjoin the board wiring pads 25(5) on the package board 21. In other words, the memory controller 23' is arranged such that the bonding pads 23'c thereof are directed to adjoin the board wiring pads 25(4) on the package board 21 and that the bonding pads 23'b thereof are directed to adjoin the wiring pads 244'a on the power supply chip 24'.

The following description is given to electrical connections between the semiconductor chips 22(1), 22(2), the memory controller 23' and the power supply chip 24'. They are connected with each other via bonding wires 26 ([Wire 1']-[Wire 5']). The electrical connection relations through the bonding wires 26 in the present embodiment include five wiring groups ([Wire 1']-[Wire 5']) as shown below.

| | |
|---|---|
| [Wire 1'] | 22(1){22a}-21{25(1)} |
| | 22(1){22a}-21{25(2)} |
| | 22(2){22a}-21{25(1)} |
| | 22(2){22a}-21{25(2)} |
| | 24'{241'}-21{25(1)} |
| | 24'{242'}-21{25(2)} |
| [Wire 2'] | 24'{244'b}-21{25(3)} |
| [Wire 3'] | 23'{23'c}-21{25(4)} |
| [Wire 4'] | 23'{23'a}-24'{25(5)} |
| [Wire 5'] | 23'{23'b}-24'{244'a} |

In the semiconductor device according to the tenth embodiment configured as above, the power supply chip 24' includes the wiring patterns 245', and accordingly this configuration can reduce the need for using bonding wires in connections extending a long distance between pads. For example, in FIG. 12, the bonding pads 23'b on the memory controller 23' can be electrically connected via the wiring patterns 245' to the board circuit patterns 25(3).

Therefore, it is possible to suppress the risk of bringing adjacent bonding wires 26 into contact with each other to make a short circuit therebetween. In addition, the length of the bonding wire 26 can be shortened to lower the inductance.

The configuration according to the above tenth embodiment can relieve the spatial restriction between chips similar to the first through ninth embodiments. In addition, the relief from the spatial restriction makes it possible to realize a multi-chip package semiconductor device (memory system) at a low cost.

Eleventh Embodiment

Figure 13:
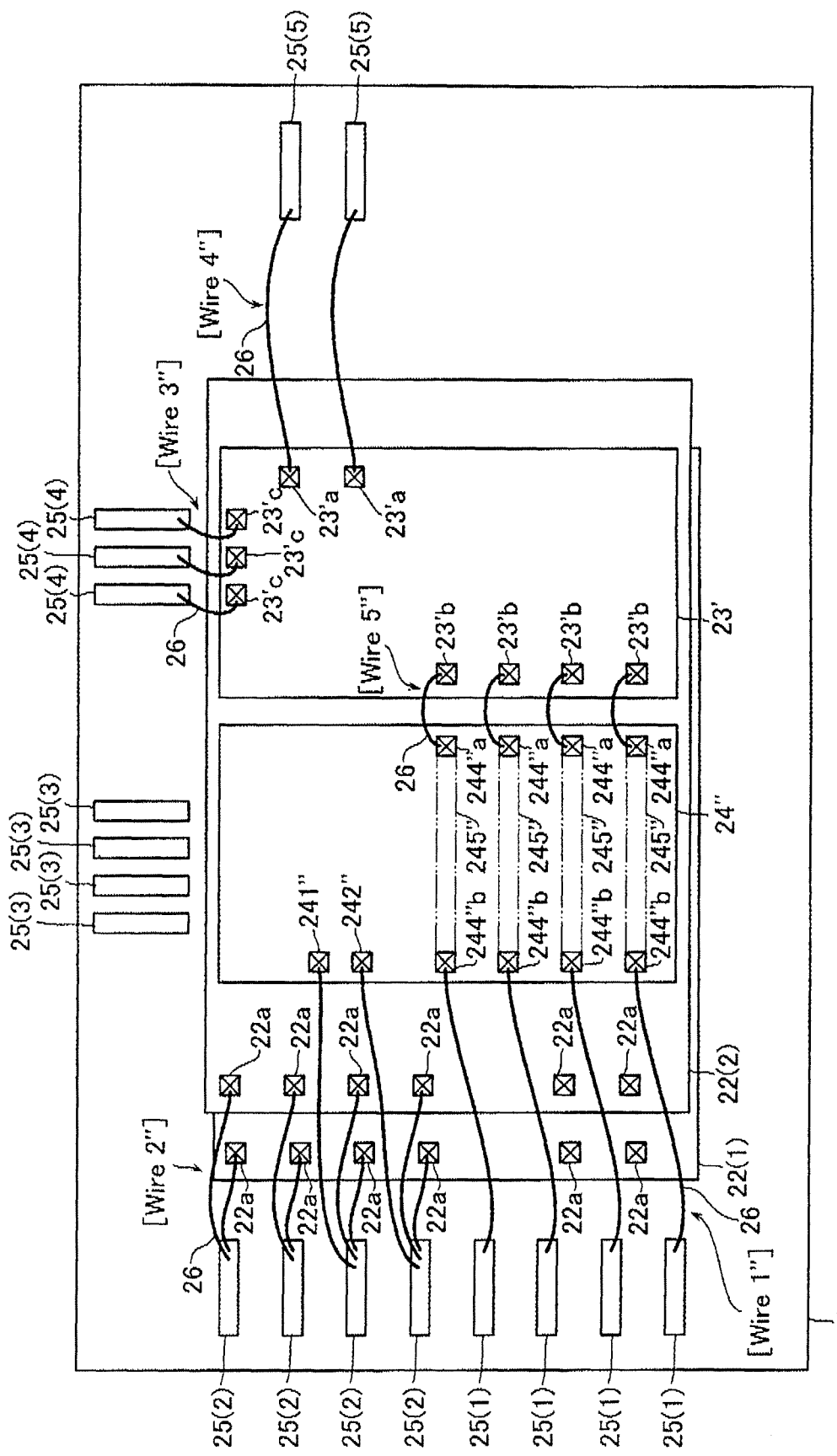
FIG. 13 is a brief top view of a semiconductor device according to an eleventh embodiment of the present invention.
Figure 14:
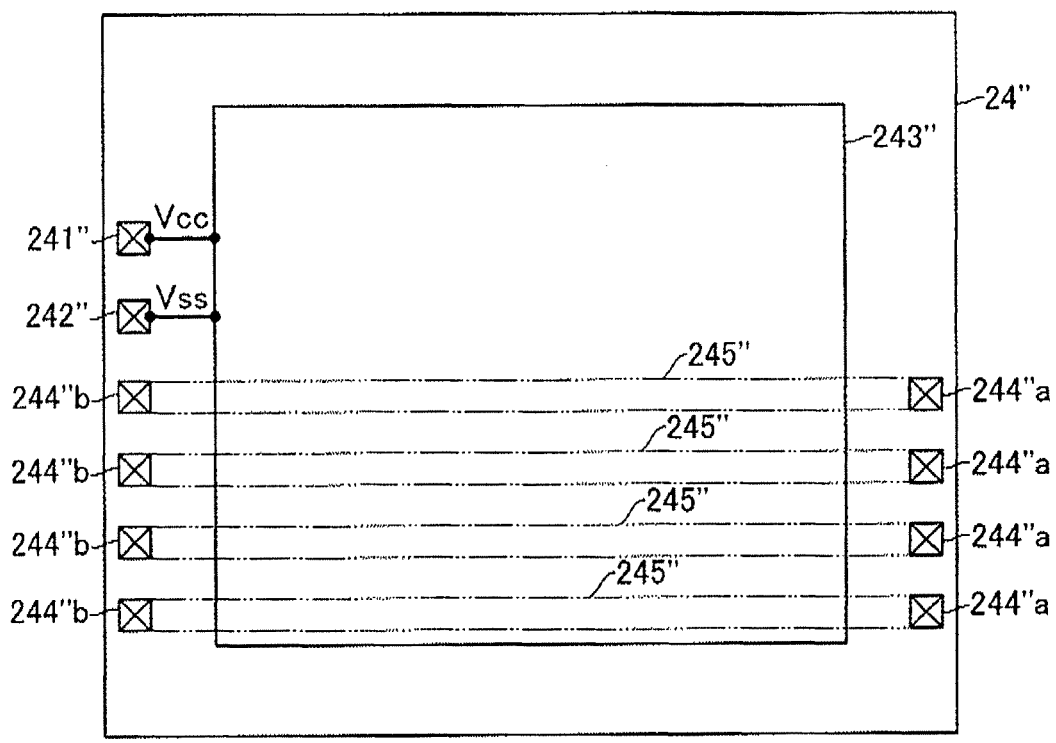
FIG. 14 is a brief top view of a power supply chip in the semiconductor device according to the eleventh embodiment of the present invention.

FIGS. 13 and 14 are referenced next to describe a configuration of a semiconductor device according to an eleventh embodiment of the present invention. FIG. 13 is a top view showing the configuration of the semiconductor device according to the eleventh embodiment of the present invention, and FIG. 14 is a top view showing a configuration of a power supply chip. The same components as those in the tenth embodiment are denoted with the same reference numerals and omitted from the following description.

The semiconductor device according to the eleventh embodiment includes a power supply chip 24", which is different in configuration from the tenth embodiment.

The power supply chip 24" is rectangular as shown in FIG. 14 and includes a supply voltage pad 241" and a ground voltage pad 242" formed in parallel along one short side edge. The supply F) voltage pad 241" and the ground voltage pad 242" are connected to a capacitor 243". The power supply chip 24" also includes first wiring pads 244"a along the other short side edge and second wiring pads 244"b along one short side edge. The first wiring pads 244"a are electrically connected to the second wiring pads 244"b via wiring patterns 245".

The following description is given to the arrangement associated with the package board 21, and the rectangular semiconductor chips 22(1), 22(2), the memory controller 23" and the power supply chip 24", which are stacked on the package board 21.

The semiconductor chip 22(1) is stacked on the package board 21 such that the bonding pads 22a are directed to adjoin the board circuit patterns 25(1), 25(2) on the package board 21.

The semiconductor chip 22(2) is stacked on the semiconductor chip 22(1) such that the bonding pads 22a thereof are directed to adjoin the bonding pads 22a on the semiconductor chip 22(1).

The power supply chip 24" is stacked on the semiconductor chip 22(2) such that the wiring pads 244"b are directed to adjoin the bonding pads 22a on the semiconductor chip 22(2).

The memory controller 23' is stacked on the semiconductor chip 22(2) in parallel with the power supply chip 24" such that the bonding pads 23'b thereof are directed to adjoin the wiring pads 244"a on the power supply chip 24".

The following description is given to electrical connections between the semiconductor chips 22(1), 22(2), the memory controller 23' and the power supply chip 24". They are connected with each other via bonding wires 26. The electrical connection relations through the bonding wires 26 in the present embodiment include five wiring groups ([Wire 1"]-[Wire 5"]) as shown below.

| | |
|---|---|
| [Wire 1"] | 21{25(1)}-24"{244"b} |
| [Wire 2"] | 22(1){22a}-21{25(2)} |
| | 22(2){22a}-21{25(2)} |
| | 24"{241"}-21{25(2)} |
| | 24"{242"}-21{25(2)} |
| [Wire 3"] | 23'{23'c}-21{25(4)} |
| [Wire 4"] | 23'{23'a}-24'{25(5)} |
| [Wire 5"] | 23'{23'b}-24"{244"a} |

In the semiconductor device according to the eleventh embodiment configured as above, the power supply chip 24" includes the wiring patterns 245', and accordingly this configuration can reduce the need for using bonding wires 26 in connections extending a long distance between pads. For example, in FIG. 13, the bonding pads 23'b on the memory controller 23' can be electrically connected via the wiring patterns 245" to the board circuit patterns 25(1).

Therefore, it is possible to suppress the risk of bringing adjacent bonding wires 26 into contact with each other to make a short circuit therebetween. Alternatively, it is possible to lower the inductance in relation to the bonding wire 26.

The configuration according to the above eleventh embodiment can relieve the spatial restriction between chips similar to the first through tenth embodiments. In addition, the relief from the spatial restriction makes it possible to realize a multi-chip package semiconductor device (memory system) at a low cost.

Twelfth Embodiment

Figure 15:
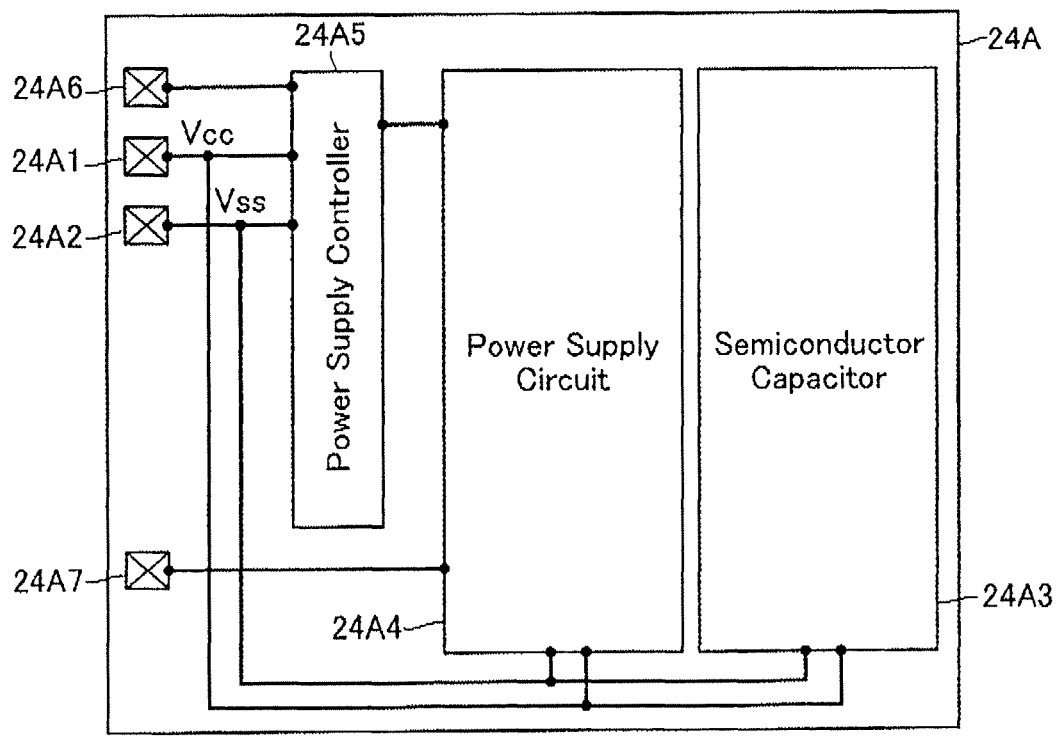
FIG. 15 is a brief top view of a power supply chip in a semiconductor device according to a twelfth embodiment of the present invention.

FIG. 15 is referenced next to describe a configuration of a semiconductor device according to a twelfth embodiment of the present invention. FIG. 15 is a top view showing a configuration of a power supply chip in the semiconductor device according to the twelfth embodiment of the present invention. The whole configuration of the semiconductor device may be any aspect of the first through tenth embodiments.

A power supply chip 24A according to the twelfth embodiment includes a mounted function of generating internal power, different from the power supply chip for supplying power from external as described above. As shown in FIG. 15, the power supply chip 24A includes, like the above configuration, a supply voltage pad 24A1, a ground voltage pad 24A2, and a semiconductor capacitor 24A3 connected to the supply voltage pad 24A1 and the ground voltage pad 24A2. In addition to the above configuration, the power supply chip 24A includes a power supply circuit 24A5 connected to the supply voltage pad 24A1 and the ground voltage pad 24A2 and configured to generate internal potentials, and a power supply controller 24A5 configured to control the internal potentials. The power supply controller 24A4 is provided with a control signal pad 24A6 for exchanging the control signal with the memory controller 23. The power supply circuit 24A4 provides with an internal power supply pad 24A7 for supplying internal power.

In accordance with the above configuration, the semiconductor device according to the twelfth embodiment is configured to generate internal power inside the power supply chip 24A and supply it to the semiconductor chip 22 and the memory controller 23. Therefore, it is not required for the semiconductor device according to the twelfth embodiment to provide the semiconductor chip and the memory controller with the power supply controller 24A4 and the power supply circuit 24A5. Therefore, it is possible to reduce the area of the semiconductor chip and the memory controller. Further, it is possible to relieve the spatial restriction when the package is downsized.

The configuration according to the above twelfth embodiment can relieve the spatial restriction between chips. In addition, the relief from the spatial restriction makes it possible to realize a multi-chip package semiconductor device (memory system) at a low cost.

Thirteenth Embodiment

Figure 16:
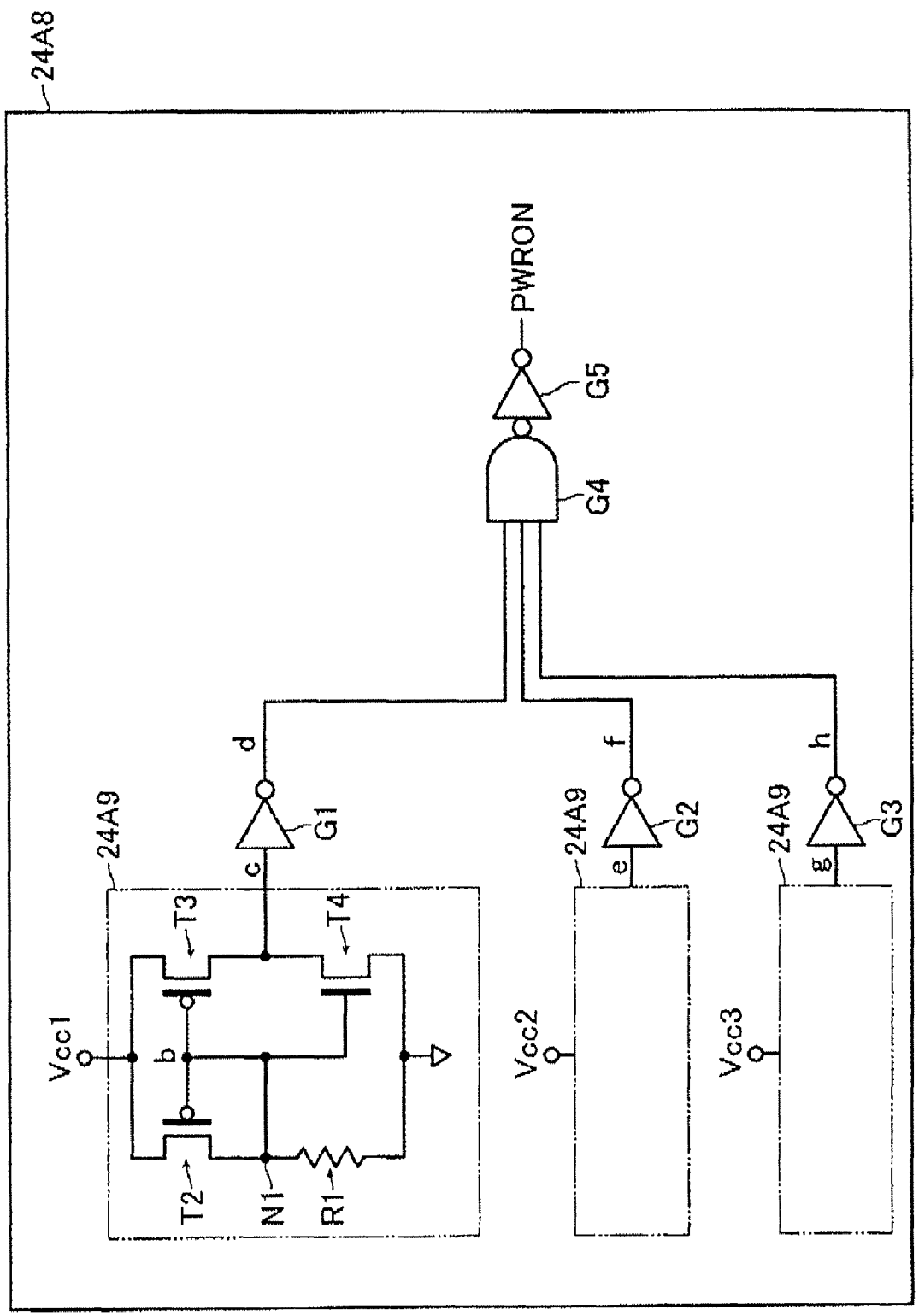
FIG. 16 is a brief diagram of a power-on reset circuit in a semiconductor device according to a thirteenth embodiment of the present invention.

FIG. 16 is referenced next to describe a configuration of a semiconductor device according to a thirteenth embodiment of the present invention. The semiconductor device according to the thirteenth embodiment of the present invention is configured such that the power supply controller 24A4 in the power supply chip 24A includes a power-on reset circuit 24A8. FIG. 16 is a circuit diagram showing a configuration of the power-on reset circuit in the semiconductor device according to the thirteenth embodiment of the present invention. The power-on reset circuit 24A8 initializes internal potentials in the semiconductor chip 22 and the memory controller 23 and enables them to exchange signals to/from external.

As shown in FIG. 16, the power-on reset circuit 24A8 in the semiconductor device according to the thirteenth embodiment of the present invention includes a plurality of power-on detectors 24A9; inverters G1, G2, G3 provided at the output side of the power-on detectors 24A9; a NAND gate G4 operative to receive the outputs from the inverters G1, G2, G3; and an inverter G5 operative to receive the output signal from the NAND gate G4. FIG. 16 shows three power-on detectors 24A9 though a much greater number of power-on detectors 24A9 may be contained.

Each power-on detector 24A9 includes two PMOS transistors T2, T3, an NMOS transistor T4, and a resistor R4. The PMOS transistors T2, T3 have respective source electrodes, which are connected to an internal voltage in the semiconductor chip 22 or the memory controller 23 via bonding wires 26. The source electrodes of the three power-on detector 24A9 are connected to supply voltages, which are referred to as Vcc1, Vcc2, Vcc3.

The transistor T2 has a drain electrode, which is connected commonly to the gate electrodes of the transistors T2 and T3 and one terminal of the source electrode of the NMOS transistor T4. Another terminal of the resistor R1 and the drain electrode of the NMOS transistor T4 are connected to the ground potential Vss. The drain electrodes of the PMOS transistor T3 and the NMOS transistor T4 are connected with each other. The gate electrodes of the PMOS transistors T2, T3 and the NMOS transistor T4 are connected to a node N1 at which the PMOS transistor T2 is connected to the resistor R1.

Figure 17:
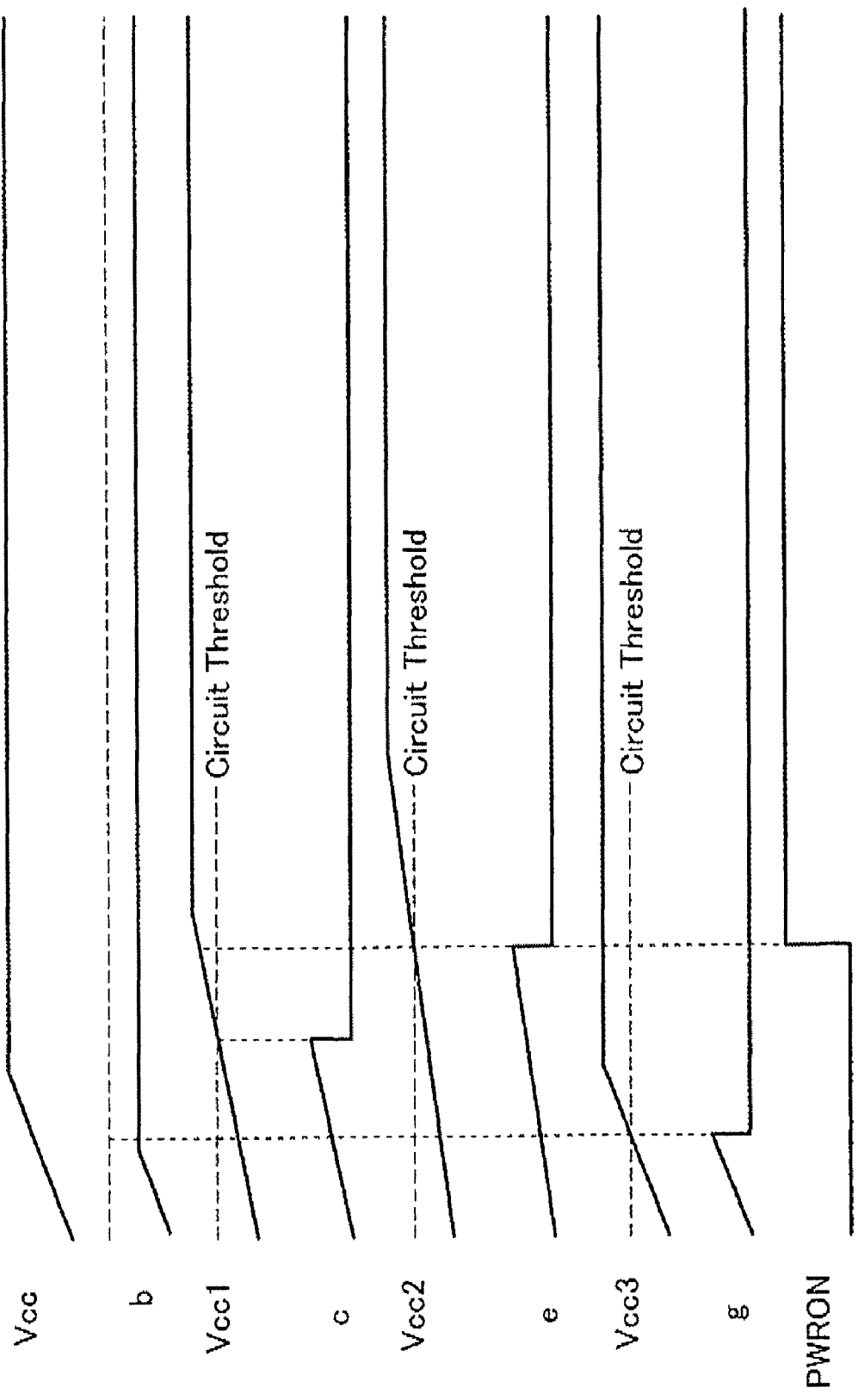
FIG. 17 is a waveform diagram showing an operation timing of the power-on reset circuit in the semiconductor device according to the thirteenth embodiment of the present invention.

FIG. 17 is referenced next to describe operation of the power-on reset circuit 24A8. It is assumed herein that the node N1 is at a potential b; the output signals from the power-on detectors 24A9 are at potentials c, e, g; the output signals from the inverters G1, G2, G3 are at potentials d, f, h; and the output signal from the NAND gate G4 is at a potential PWRON.

As shown in FIG. 17, as the supply voltage Vcc gradually rises from the off-state, the internal voltages Vcc1, Vcc2, Vcc3 in the semiconductor chip 22 or the memory controller 23 also rise accordingly. The rising rate varies one by one among the semiconductor chips 22 and the memory controllers 23 depending on the wiring-related resistance and capacitance and so forth. When the potential b on the node in each power-on detector 24A9 rises above the threshold of the NMOS transistor T4, the transistor T4 turns on and causes the potentials c, e, g to make a transition to "Low". When the potentials c, e, g from all the power-on detectors 24A9 are made "Low" the potentials d, f, h are made "High". Therefore, the potential PWRON makes a transition from "Low" to "High".

When the potential PWRON is fed from the power supply chip 24 to the semiconductor chip 22 and the memory controller 23, the semiconductor chip 22 and the memory controller 23 are allowed to initialize the internal potentials and exchange signals to/from external.

Therefore, the configuration of the above thirteenth embodiment eliminates the need for providing the semiconductor chip 22 and the memory controller 23 with the power-on reset circuit 24A8. Accordingly, it is possible to reduce the area of the semiconductor chip and the memory controller. Further, it is possible to relieve the spatial restriction when the package is downsized.

The configuration according to the above thirteenth embodiment can relieve the spatial restriction between chips similar to the first through twelfth embodiments. In addition, the relief from the spatial restriction makes it possible to realize a multi-chip package semiconductor device (memory system) at a low cost.

What is claimed is:

1. A semiconductor device, comprising:
    a board;
    a semiconductor chip;
    a memory controller operative to control said semiconductor chip; and
    a power supply chip having a capacitor,
    said semiconductor chip being stacked on said board,
    said memory controller and said power supply chip being stacked on said semiconductor chip,
    said semiconductor chip or said memory controller being stacked on said power supply chip,
    said capacitor being used to stabilize the voltage applied to said semiconductor chip,
    said power supply chip being rectangular shaped as viewed from above, and
    said power supply chip comprising:
        a plurality of first electrodes provided along only a longer side of said power supply chip;
        a plurality of second electrodes provided along only a shorter side of said power supply chip; and
        a plurality of corresponding wiring patterns electrically connecting said plurality of first electrodes and said plurality of second electrodes.

2. The semiconductor device according to claim 1, wherein said semiconductor chip, said memory controller and said power supply chip have respective electrodes on at least one side,
    wherein said semiconductor chip, said memory controller and said power supply chip are stacked such that said electrodes can be subjected to bonding.

3. The semiconductor device according to claim 2, wherein said semiconductor chip and said power supply chip are stacked as deviated so that one ends thereof are arranged in a stepwise form.

4. The semiconductor device according to claim 2, wherein said semiconductor chip and said power supply chip are stacked as alternately deviated.

5. The semiconductor device according to claim 2, wherein said plurality of first and second electrodes are electrically connected via bonding wires to board circuit patterns provided on said board.

6. The semiconductor device according to claim 5, further comprising board wiring patterns provided in said board and electrically connected to said board circuit patterns.

7. The semiconductor device according to claim 5, further comprising solder balls provided on a lower surface of said board and electrically connected to said board wiring patterns.

8. The semiconductor device according to claim 1, further comprising a sealant for sealing said semiconductor chip, said memory controller and said power supply chip stacked on said board.

9. The semiconductor device according to claim 1, wherein said power supply chip includes
    a power supply unit operative to supply power to at least one of said semiconductor chip and said memory controller, and
    a power supply controller operative to control power supplied from said power supply unit.

10. The semiconductor device according to claim 1, wherein said power supply chip includes a power-on reset unit operative to read at least one of potentials on said semiconductor chip and said memory controller and, if all values of said potentials read exceed a pre-determined threshold, provide a control signal to initialize at least one of internal potentials in said semiconductor chip and said memory controller.

* * * * *